(12) United States Patent
Barr et al.

(10) Patent No.: US 8,817,837 B2
(45) Date of Patent: Aug. 26, 2014

(54) LASER SYSTEM AND METHOD OF OPERATION

(75) Inventors: John Barr, Basildon (GB); Andrew White, Basildon (GB); Stephen Moore, Basildon (GB)

(73) Assignee: Selex ES Ltd, Essex (GB)

( * ) Notice: Subject to any disclaimer, the term of this patent is extended or adjusted under 35 U.S.C. 154(b) by 0 days.

(21) Appl. No.: 13/988,521

(22) PCT Filed: Nov. 21, 2011

(86) PCT No.: PCT/EP2011/070552
§ 371 (c)(1),
(2), (4) Date: May 21, 2013

(87) PCT Pub. No.: WO2012/069409
PCT Pub. Date: May 31, 2012

(65) Prior Publication Data
US 2013/0250995 A1    Sep. 26, 2013

(30) Foreign Application Priority Data
Nov. 25, 2010    (GB) .................. 1020008.7

(51) Int. Cl.
*H01S 5/00*    (2006.01)
*H01S 3/08*    (2006.01)
*H01S 3/091*   (2006.01)
*H01S 3/093*   (2006.01)
*H01S 3/0933*  (2006.01)
*H01S 3/0941*  (2006.01)
*H01S 3/102*   (2006.01)
*H01S 3/16*    (2006.01)

(52) U.S. Cl.
CPC .............. *H01S 3/08059* (2013.01); *H01S 3/08* (2013.01); *H01S 3/08095* (2013.01); *H01S 3/091* (2013.01); *H01S 3/093* (2013.01); *H01S 3/0933* (2013.01); *H01S 3/0941* (2013.01); *H01S 3/1022* (2013.01); *H01S 3/1611* (2013.01); *H01S 3/1608* (2013.01); *H01S 3/1643* (2013.01)

USPC ........... 372/50.12; 372/69; 372/75; 372/101; 372/107

(58) Field of Classification Search
CPC ... H01S 3/08; H01S 3/08059; H01S 3/08095; H01S 3/091; H01S 3/093; H01S 3/0933; H01S 3/0941; H01S 3/1022; H01S 3/1611; H01S 3/1608; H01S 3/1643
USPC ................... 372/50.12, 69, 75, 101
See application file for complete search history.

(56) References Cited

U.S. PATENT DOCUMENTS 5,627,849 A * 5/1997 Baer ............................ 372/31
6,738,396 B2 * 5/2004 Filgas et al. ................ 372/19
(Continued)

FOREIGN PATENT DOCUMENTS

EP    0401054 A2    12/1990
EP    1744413 A2    1/2007
(Continued)

OTHER PUBLICATIONS

International Search Report (PCT/ISA/210) issued on Mar. 26, 2012, by the European Patent Office as the International Searching Authority for International Application No. PCT/EP2011/070552.

(Continued)

*Primary Examiner* — Dung Nguyen
(74) *Attorney, Agent, or Firm* — Buchanan Ingersoll & Rooney

(57) ABSTRACT

An exemplary laser system is disclosed which includes a pump laser diode array and laser gain material, in which the array generates optical radiation having a predetermined total linewidth approximately 20 nm wide constructed from a plurality of individual wavelengths with a linewidth of up to 8 nm, the center wavelength of radiation being for example within the absorption band of laser gain material used at the center point of the operating temperature of the array. The system can include a highly reflecting plane mirror with periodic transmitting patches placed between the laser diode array and the laser gain material, the size of the transmitting patches being such that minimal pump radiation is lost.

15 Claims, 3 Drawing Sheets

(56) References Cited

U.S. PATENT DOCUMENTS

| | | |
|---|---|---|
| 7,039,087 B2 | 5/2006 | Nettleton et al. |
| 7,397,828 B2 | 7/2008 | DePriest et al. |
| 2002/0051479 A1 | 5/2002 | Fujikawa et al. |
| 2004/0228383 A1* | 11/2004 | Krupke .................. 372/75 |
| 2006/0291520 A1 | 12/2006 | DePriest et al. |

FOREIGN PATENT DOCUMENTS

| | | |
|---|---|---|
| EP | 1887666 A2 | 2/2008 |
| JP | 1-205484 A | 8/1989 |

OTHER PUBLICATIONS

A. Faulstich et al., Face pumping of thin, solid-state slab lasers with laser diodes, Optics Letters, vol. 21, No. 8, Apr. 15, 1996, pp. 594-596.

J.R.Lee et al., High-average-power Nd:YAG planar waveguide laser that is face pumped by 10 laser diode bars, Optics Letters, vol. 27, No. 7, Apr. 1, 2002, pp. 524-526.

* cited by examiner

LASER SYSTEM AND METHOD OF OPERATION

The present invention relates to a semiconductor laser system. More specifically but not exclusively, the invention relates to a pumped solid state laser and method of operation. In particular the present invention relates to a more optimal temperature insensitive design of pump head used in a semiconductor pumped solid state laser.

The invention relates to the operation of a laser diode array pumped solid state laser over a wide temperature range without using thermal control of the laser diode temperature. Thermal control of laser diode wavelength is needed as the wavelength of such a laser diode can typically varies by 0.27 nm° $C.^{-1}$. Many existing designs of laser diode pumped solid state lasers require that the laser diode temperature is maintained over a small range, normally at an elevated temperature, in order to maintain the pump wavelength at an optimal value. This complicates the design of the laser leading to higher power consumption, increased number of parts and longer warm up times. Incorporation of the system described in more detail below in such a device can produce a smaller arrangement and that tends to be lighter than equivalent systems using existing designs.

Techniques are known to reduce the impact of variation in the laser diode wavelength. Those used in this invention are: (1) increased absorption path length; (2) increased wavelength diversity and (3) pump power/energy variation.

Methods for achieving these objectives are known.

U.S. Pat. No. 7,039,087 (End pumped slab laser cavity, Nettleton et al, 2006) discloses an end pumped system that uses a long absorption length to achieve temperature insensitivity.

U.S. Pat. No. 7,397,828 (Laser system with multiple wavelength diode pump head and associated method, DePriest et al 2008) discloses a diffusely reflecting enclosure with wavelength diverse laser diodes to achieve temperature insensitivity.

In general, the solutions described in the documents described above and other known solutions tend to have defects. For example the architecture may not be scalable to allow different output powers (e.g. end pumping) or may require additional components (e.g. a diffuse reflector).

Accordingly, one form of the invention described here provides a simple solution that is scalable in energy and minimises the part count.

The invention will now be described with reference to the following drawings in which.

Figure 1:
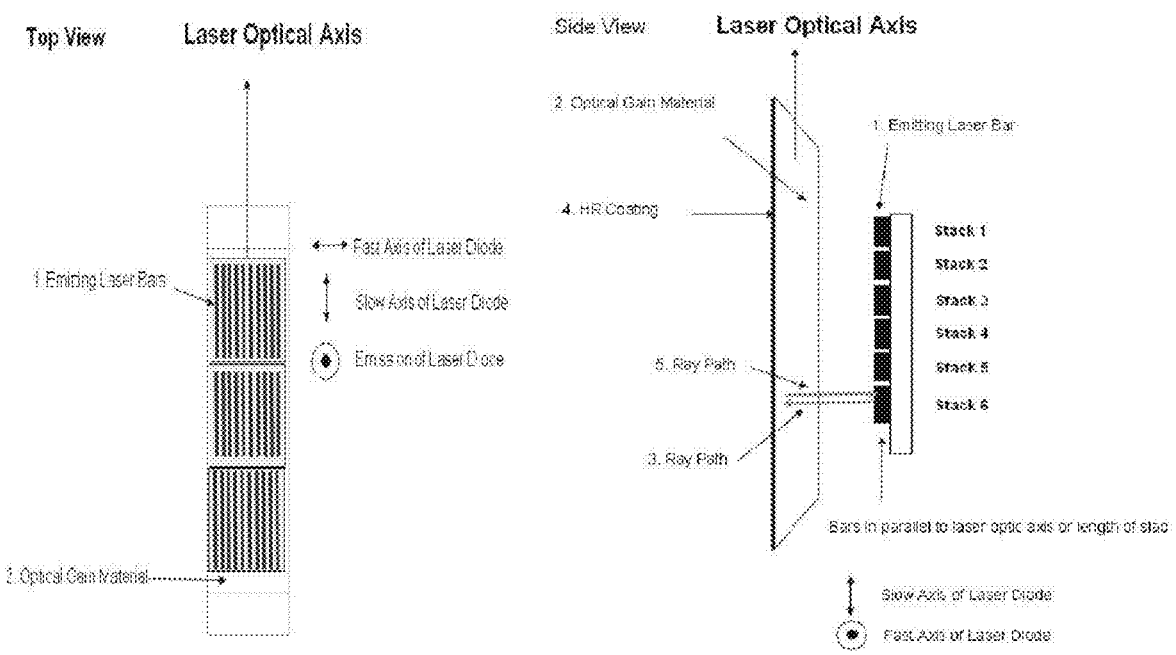
FIG. 1 shows a schematic diagram of a laser diode array pumped solid state arrangement in accordance with the invention.

Generally, the invention consists of a laser diode array (1) side pumping a rectilinear slab gain material (2) of Nd:YAG. In a first embodiment of the invention, a rectilinear slab or a zigzag slab of gain material is used that compensates for a thermal lens. The pump light travels from the laser diode array through the optical gain material where some is absorbed (3). The rest of the pump light is reflected from a highly reflecting coating (4) on the rear of the slab and makes a second pass through the gain material (5). Any light that leaves the gain material is subsequently lost. FIG. 1 shows this geometry.

The improved geometry uses recently developed laser diodes that utilise a bar length equal to the width of the slab, in this case 5 mm. The technology is described in 1887666 A2 (Method and system for a laser diode bar array assembly, McElhinney et al 2008). The benefit of this is the fast axis divergence of the laser diode, which can be as large as 50°, is in the direction of the long axis of the slab. The first embodiment, shown in FIG. 1, uses 10 mm bars (1) where the divergence is across the narrow axis of the slab. An increased absorption length can be achieved by ensuring that the light exiting the slab is largely reflected or scattered back into the slab for another pass.

Figure 2:
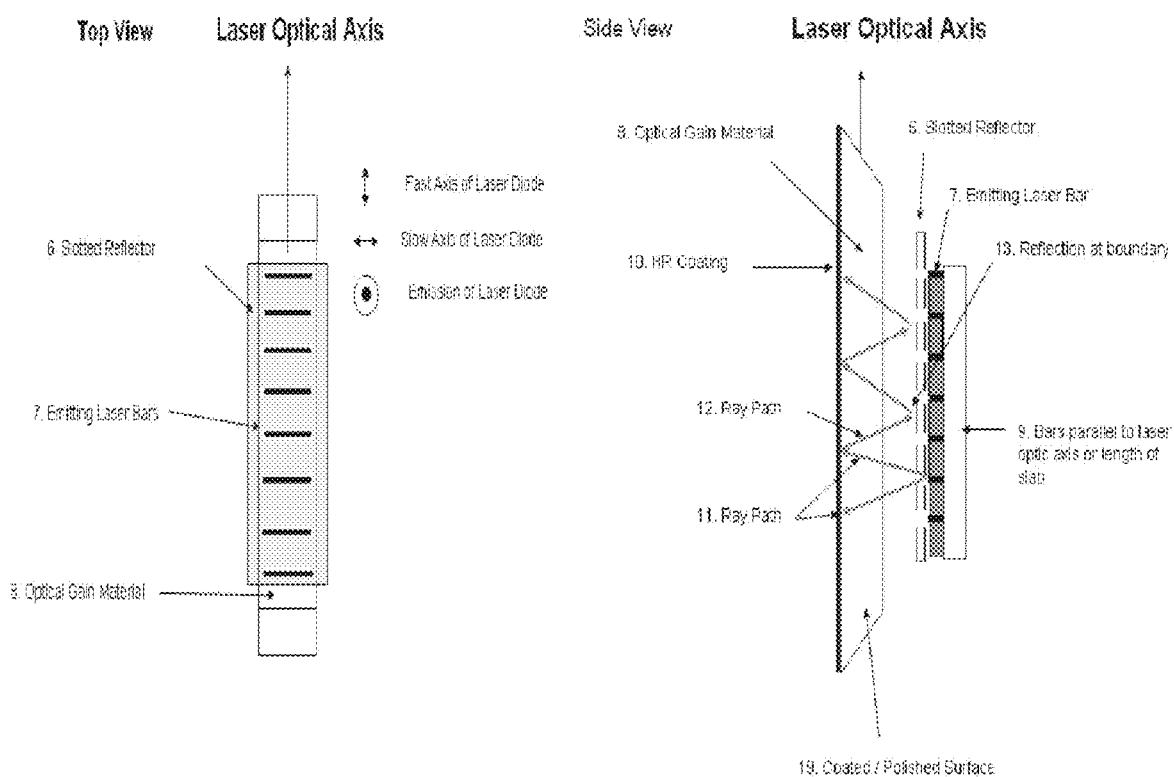
FIG. 2 shows a schematic diagram of one form of laser diode array in accordance with the invention having a pump setup with slotted reflector.
Figure 3:
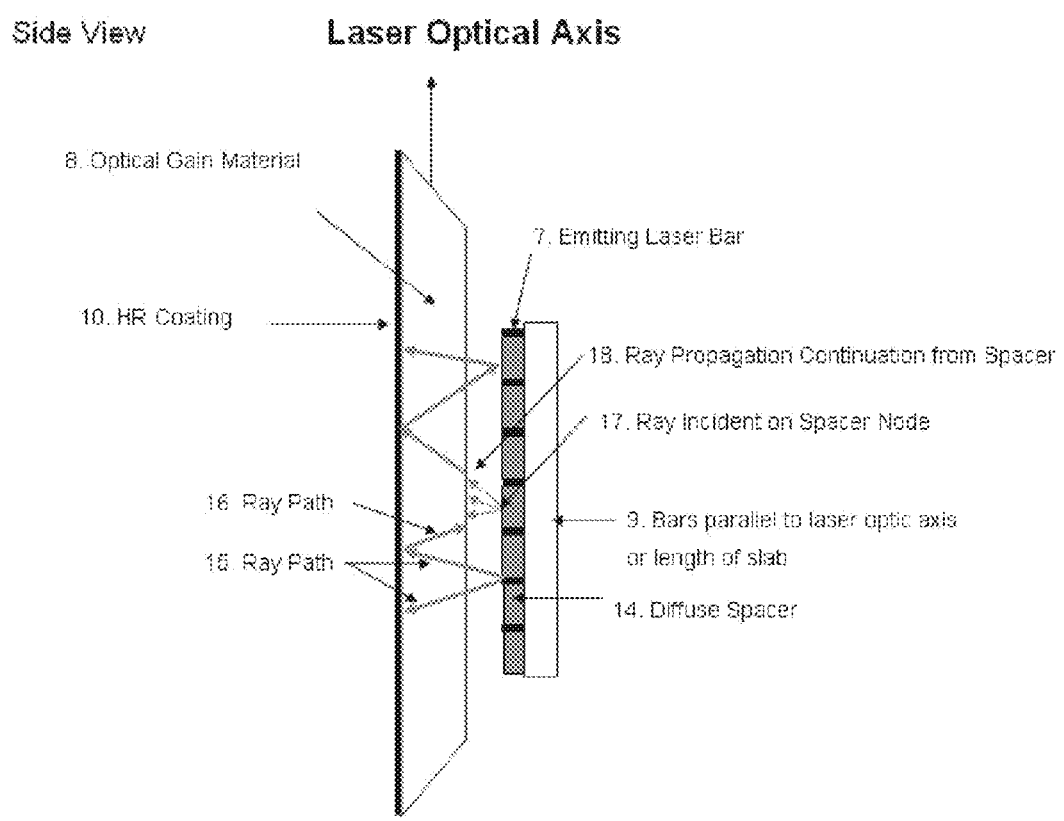
FIG. 3 shows a schematic diagram of another form of laser diode array in accordance with the invention having a pump setup with partially reflecting partially diffuse spacers.

Two techniques for achieving the reflection back into the gain material are part of this invention. A highly reflecting plane mirror with periodic patches of high transmission (6) can be placed between the laser diodes stacks (7) and the slab (8). The highly transmitting patches are aligned with the laser diodes in the stack. This device is referred to as the slotted reflector. A second simpler technique is to make use of the spacers within the laser diode array stack construction. These spacers provide partially diffuse partially specular reflections. In both cases the spacing between the laser diodes bars can be varied to optimise the reflection coefficient, typically a larger spacing than the conventional 400 µm pitch can be selected. The geometries are shown in FIGS. 2 and 3 respectively.

To maintain the absorption coefficient as the temperature is changed it is known that increasing the linewidth of the pump source is effective. The construction of laser diode arrays makes achieving this a simple matter since each bar in a multi-bar array can have a different wavelength. In practice an optimal number of wavelengths are either 3 or 4. The wavelength range is determined by the temperature range over which temperature insensitive performance is desired, in our case the 110° C. temperature range corresponds to a 30 nm wavelength range.

Finally the steps outlined above significantly reduce the variation in absorbed energy over temperature. To produce a highly stable laser in terms of output energy an additional stage of varying the pump power from the laser diodes can be used. In practice variation from about 180 µs to 220 µs is sufficient.

It will be appreciated that the methods and techniques described above can be applied to amplifiers as well as to lasers.

The configuration is described as, but is not limited to, a rectilinear slab or a zigzag slab of Nd:YAG. Other embodiments could include rod or disk geometries. The invention can still be applied in these configurations.

The active gain medium described above is typically Nd:YAG. Other configurations may embody a different active medium. The invention can still be applied for these instances.

Scaling the energy is simply achieved by increasing the length of the gain material and adding additional laser diode arrays.

The laser pump source shown in FIG. 2 is configured from a slotted reflector (6) placed in front of a stack of emitting bars (7). The laser bars are directed towards the gain material, adjacent to the emitting region (8). Each laser bar output will have an angular divergence of up to 50 degrees in the long axis plane of the gain material (9). The high transmission patches of the slotted reflector are aligned with the emitting regions of the laser bar. The physical spacing between bars, and the width of each transmitting region should typically be no smaller than 400 μm for thermal management reasons. Heat sinking of the device can be achieved in all directions either by conduction cooling or active cooling using liquid. For the purposes of this embodiment the active medium is cooled from the rear surface. The rear surface active medium also has a highly reflective coating (10). Each ray (11) propagates towards the active gain medium and is partially absorbed. The ray (11) will then be incident on the back surface of the gain medium and reflected. The ray (12) propagates back through the active gain medium and is incident on the slotted reflector (13). The reflecting surface will provide a reflection and may also modify the angle of propagation. This process of transmission through the gain medium will be repeated until the energy is substantially absorbed.

In another configuration shown in FIG. 3, the space between each emitting bar is populated by a partially diffuse, partially reflecting spacer (14). The spacer may also allow for heat extraction from the emitters. Each ray (15) propagates through the active gain medium, reflects from the highly reflective surface on the rear of the gain medium and will be incident on the partially diffuse, partially reflecting spacer (16). The ray (17) will be partially reflected and partially scattered allowing for another pass of the slab. This process of transmission through the gain medium will be repeated until the energy is substantially absorbed (18).

Furthermore, the configurations can be enhanced by having a polished surface at the top or bottom of the slab (19). This will then confine the light in all directions. The main losses will then arise from beam walk off from the slab and scattering reflector, reflection back into the arrays of up which to 30% will be reflected back and any other factors which reduce the scattering efficiency. The design should also consider the trade off between the benefit added by this implementation, and the risk of amplified spontaneous emission affecting the overall laser performance.

The invention claimed is:

1. A laser system comprising:
a laser pump having a pump laser diode array for generating optical radiation having a predetermined total linewidth approximately 20 nm wide constructed from a plurality of individual wavelengths with a linewidth of up to 8 nm, the centre wavelength of said radiation being substantially within an absorption band of laser gain material included at a centre point of an operating temperature of the laser diode array; and
a highly reflecting plane mirror with periodic transmitting patches placed between the laser diode array and the laser gain material, a size of the transmitting patches being selected for minimizing pump radiation loss.

2. A laser system according to claim 1, in which the spacing between transmitting patches is equal to bar spacing of the laser diode array.

3. A laser system according to claim 1, in which the laser pump contains a series of pump bars that are a same length as a width of the laser gain material and are placed transversely to a long axis of the laser gain material.

4. A laser system according to claim 1, in which the laser gain material is in zigzag slab geometry.

5. A laser system according to claim 1, in which the laser gain material comprises:
a highly reflective surface on a rear face perpendicular to a direction of pump emission.

6. A laser system according to claim 5, in which the reflecting plane mirror and highly reflective surface define a pump cavity to confine diode pump radiation, and are arranged such that a laser pump source of the laser pump will emit light into the pump cavity.

7. A laser system according to claim 1, comprising:
spacer elements of the laser diode array for retro-reflecting pump light, the spacer elements being partially diffuse and partially reflecting.

8. A laser system according to claim 7, in which the spacer elements are highly reflecting elements.

9. A laser system according to claim 1, comprising:
a control for varying pump energy of the laser diode array as a function of temperature such that a consistent amount of absorbed energy will be achieved within the laser gain material over temperature.

10. A laser system according to claim 1, in which the laser gain material is one of a rod or a rectilinear slab.

11. A laser system according to claim 1, in which the laser gain material is Nd:YAG or other Nd doped host material.

12. A laser system according to claim 1, comprising:
a control for modifying wavelength and linewidth of the laser system to achieve temperature insensitive performance with the laser gain material.

13. A laser system according to claim 1, in which the laser gain material comprises:
specular surfaces on faces perpendicular to an optic axis of the laser gain material to further confine laser light.

14. A laser system according to claim 1, in which the laser diode array is configured to produce an emission which consists of:
a single emission wavelength provided an absorption bandwidth of a host material of the laser gain material is large enough to accommodate temperature insensitive operation over a specified range.

15. A laser system according to claim 1, in which the laser gain material is such as Er, Yb, Ho, Cr or a Tm doped host material.

* * * * *